(12) United States Patent
Woo

(10) Patent No.: US 7,846,621 B2
(45) Date of Patent: Dec. 7, 2010

(54) EUVL MASK, METHOD OF FABRICATING THE EUVL MASK, AND WAFER EXPOSURE METHOD USING THE EUVL MASK

(75) Inventor: Sung Ha Woo, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 326 days.

(21) Appl. No.: 12/059,335

(22) Filed: Mar. 31, 2008

(65) Prior Publication Data

US 2009/0111032 A1      Apr. 30, 2009

(30) Foreign Application Priority Data

Oct. 31, 2007   (KR) ...................... 10-2007-0110510

(51) Int. Cl.
*G03F 1/00*   (2006.01)
(52) U.S. Cl. ........................................................ 430/5
(58) Field of Classification Search ................ 430/5, 430/30; 378/35
See application file for complete search history.

(56) References Cited

U.S. PATENT DOCUMENTS

| 6,707,123 | B2 | 3/2004 | Rau |
| 6,872,495 | B2 * | 3/2005 | Schwarzl ....................... 430/5 |
| 6,986,971 | B2 | 1/2006 | Han et al. |
| 2007/0015065 | A1 | 1/2007 | Abe et al. |
| 2007/0070322 | A1 | 3/2007 | Hudyma et al. |

FOREIGN PATENT DOCUMENTS

KR   10-2002-0056012   7/2002

* cited by examiner

*Primary Examiner*—Stephen Rosasco
(74) *Attorney, Agent, or Firm*—Marshall, Gerstein & Borun LLP

(57) ABSTRACT

A mask for extreme ultra violet lithography (EUVL) and a method of fabricating the same, and a wafer exposure method using the same. According to a method of fabricating the mask, a light reflective layer pattern is formed on a transparent substrate to reflect extreme ultraviolet light. The extreme ultraviolet light is incident to and transmitted by the transparent substrate. A light absorption layer on the transparent substrate is formed to fill between the light reflective layer patterns and absorb the extreme ultraviolet light.

3 Claims, 2 Drawing Sheets

EUVL MASK, METHOD OF FABRICATING THE EUVL MASK, AND WAFER EXPOSURE METHOD USING THE EUVL MASK

CROSS-REFERENCE TO RELATED APPLICATION

Priority to Korean patent application number 10-2007-0110510, filed on Oct. 31, 2007, the disclosure of which is incorporated by reference in its entirety, is claimed.

BACKGROUND OF THE INVENTION

The invention relates to lithography and, more particularly, to a mask for extreme ultra violet lithography (EUVL) and a method of fabricating the same, and to a wafer exposure method using the same.

As the circuit CD (Critical Dimension) of semiconductor devices has been reduced, EUVL has been developed to transfer a pattern having the resulting finer line width on a wafer. EUVL is anticipated to be the next generation technique to fabricate a smaller and faster microchip having the CD of less than approximately 32 nm. Wavelengths of lights used in EUVL typically are less than approximately 13 nm. Such light is supposedly effectively reflected by a reflector having approximately fifty double layers. One double layer comprises a molybdenum (Mo) layer and a silicon (Si) layer, each of which has a thickness of approximately 7 nm and is deposited with almost atomic scale accuracy.

Because light with a relatively short wavelength is used in EUVL, a mask structure, in which a circuit pattern to be transferred on a wafer is prepared as a mask pattern, includes a light reflective structure rather than a light transmissive structure, as used in other mask structures. An EUVL mask is fabricated by incorporating a light reflective layer and a light absorption layer pattern into the mask. The light reflective layer includes a multi-layered structure of an Mo/Si layer on a transparent substrate like a quartz substrate, and the light absorption layer pattern is formed on the light reflective layer to expose a portion of the light reflective layer. Accordingly, the light absorption layer pattern is formed according to a layout of a pattern that will be transferred on the wafer.

In this EUVL mask, the height of the light absorption layer pattern is different from that of the light reflective layer disposed below the light absorption layer. During an EUVL exposure process, an exposure light is incident to and reflected by the surface of the EUVL mask at an inclined incident angle rather than an angle perpendicular to the surface of the EUVL mask. However, because the light absorption layer pattern protrudes from the light reflective layer, incident light or reflected light can be screened by the edge of the light absorption layer pattern. Moreover, diffused reflection can occur on the light absorption layer pattern through incident light or reflected light. As a result, exposure failure may occur such that an inaccurate pattern image will be transferred on a wafer.

Furthermore, while performing an exposure process through the EUVL mask, incident light direction is adjusted to allow exposure light, i.e., extreme ultraviolet light, to be incident to and reflected by the surface of a substrate where a light reflective layer and a light absorption layer pattern are formed. Accordingly, if another passivation layer or film is introduced to protect a light reflective layer or a light absorption layer pattern, unwanted light absorption may occur due to the passivation layer or film. Accordingly, because there is a limitation in introducing a passivation layer or film, defects may occur on the surfaces of a light absorption layer pattern or a light reflective layer. This may serve as a factor for flawed pattern transfer.

SUMMARY OF THE INVENTION

In one embodiment of the invention, a method of fabricating a mask used in extreme ultra violet lithography includes: forming light reflective layer patterns on a transparent substrate to reflect extreme ultraviolet light, the extreme ultraviolet light being incident to and transmitted through the transparent substrate; and, forming a light absorption layer on the transparent substrate to fill between the light reflective layer patterns and absorb the extreme ultraviolet light.

The light absorption layer is preferably deposited to cover the light reflective layer patterns and an exposed surface of the transparent substrate between the light reflective layer patterns. The surface of the light reflective layer patterns is preferably exposed by performing a chemical mechanical polishing (CMP) process or an etch back process on the light absorption layer.

In another embodiment, a method of fabricating a mask used in extreme ultra violet lithography includes: forming light reflective layer patterns on a transparent substrate to reflect extreme ultraviolet light, the extreme ultraviolet light being incident to and transmitted by the transparent substrate; and, forming a light absorption layer on the transparent substrate to fill between the light reflective layer patterns and absorb the extreme ultraviolet light.

In still another embodiment, a wafer exposure method includes: preparing a mask including light reflective layer patterns on a transparent substrate and a light absorption layer filling between the light reflective layer patterns; allowing extreme ultraviolet light to be incident to a rear surface of the transparent substrate; and, performing an exposure process on a wafer by inducing reflected light to reach the wafer, the reflected light being incident to a rear surface of the transparent substrate after being selectively reflected by the light reflective layer pattern at an interface of the transparent substrate.

DESCRIPTION OF SPECIFIC EMBODIMENTS

In embodiments of the invention, a light reflective layer pattern is formed on one side of a transparent substrate, (e.g., a quartz substrate) according to a desirable pattern arrangement to be transferred on a wafer. A light absorption layer is coated on a region where a light absorption pattern is not arranged in order to form a mask. When extreme ultraviolet light is incident to the rear surface of the substrate and penetrates through the inner substrate, light reflection occurs at the interface between the light reflective layer pattern and the substrate, and light is also absorbed in the light absorption layer at a region where there is no light reflective layer pattern.

At this point, because the absorption surface of the light absorption layer and the light reflection surface of the light reflective layer pattern are disposed on the surface of the substrate, there is no height difference between the absorption surface and the reflection surface. Accordingly, extreme ultraviolet reflected light with a more accurate pattern image can be obtained. Additionally, when reflected light from the light reflective layer pattern is transmitted toward a reflector system, the only thin layer is the quartz substrate. Therefore, unnecessary loss of the reflected light can be prevented. Additionally, because the reflective surface and the absorbing surface are on the substrate, pattern transfer failure can be prevented even if there is fault or defect on the exposed surface of the light reflective layer pattern or the light absorption layer. Moreover, failure during pattern transfer can be suppressed and also can be easily removed through a cleaning process. Furthermore, it may be possible to introduce a passivation layer or film on the light reflective layer pattern or the light absorption layer.

Figure 1:
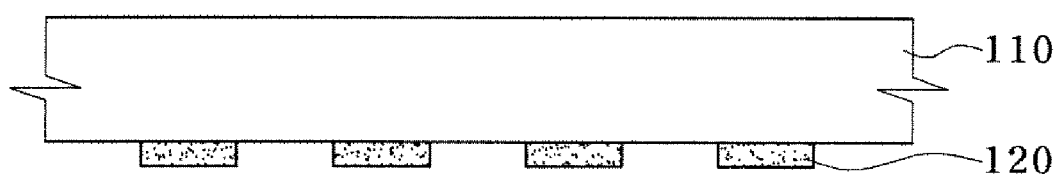
FIGS. 1 and 2 illustrate cross-sectional views of a mask used in EUVL and a method of fabricating the same according to first embodiment of the invention.
Figure 2:
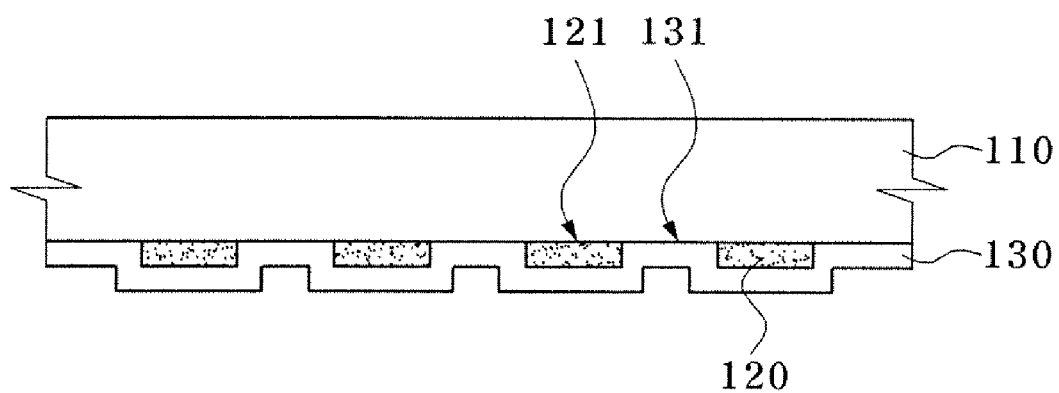
Figure 3:
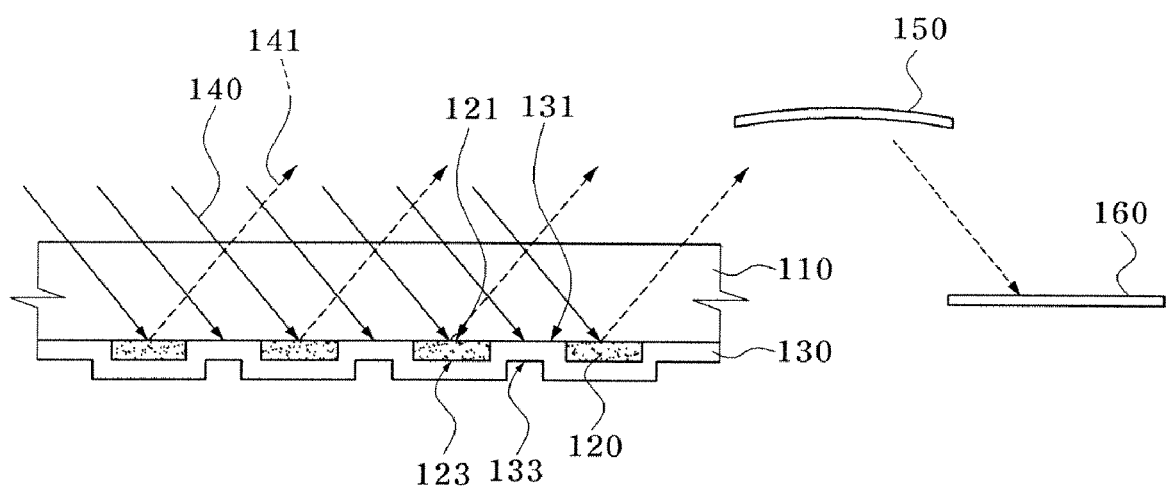
FIG. 3 illustrates an EUVL exposure method using a mask of FIG. 2.

FIGS. 1 and 2 illustrate cross-sectional views of a mask used in EUVL and a method of fabricating the same according to first embodiment of the invention. FIG. 3 illustrates an EUVL exposure method using a mask of FIG. 2.

Referring to 1, a mask used in EUVL according to the first embodiment of the invention includes a light reflective layer pattern 120 after forming and patterning a light reflective layer on one surface of a transparent substrate 110 such as a quartz substrate. At this point, the light reflective layer pattern 120 illustratively includes approximately fifty double layers, which are sequentially stacked on the transparent substrate 110. One double layer illustratively includes a molybdenum (Mo) film and a silicon (Si) double film, each of which is preferably formed at the thickness of an atomic layer. This light reflective layer pattern 120 is formed to reflect an extreme ultraviolet light of a less than 13 nm wavelength band, which is used in EUVL. The double layer of a molybdenum (Mo) film and a silicon (Si) double film is illustratively and preferably sequentially stacked at approximately fifty stories and then is patterned to have a lay out of a pattern that will be transferred on a wafer. As a result, the light reflective layer pattern 120 can be formed. This patterning process may include forming a resist pattern and performing a selective etching process.

Referring to FIG. 2, a light absorption layer 130 is deposited to cover the light reflective layer pattern 120 and a surface portion of the substrate 110 between the light reflective layer patterns 120. The light absorption layer 130 is preferably formed by including a tantalum nitride (TaN) layer that absorbs extreme ultraviolet light. Like this, because the light absorption layer 130 is formed between the light reflective layer patterns 120, the mask substantially includes the light absorption layer 130 between the light reflective layer patterns 120 on the surface of the substrate 110. Accordingly, because a first surface 121 of the light reflective layer pattern 120 and a first surface 131 of the light absorption layer 130, which are the interfaces of the surface of the substrate 110, have the same surface heights based on the surface of the substrate 110, there is no height difference between the first surface 121 and the first surface 131.

Referring to FIG. 3, according to the EUVL exposure method using the mask of FIG. 2, an extreme ultraviolet light 140 for pattern transfer, i.e., an exposure light, is incident to the rear surface of the substrate 110. Accordingly, the incident extreme ultraviolet light 140 penetrates through the inside of the substrate 110 to reach the light reflective layer pattern 120 and the light absorption layer 130 on the surface of the substrate 120. The incident extreme ultraviolet light 140 is reflected by the light reflective layer pattern 120, and is absorbed by the light absorption layer 130. Accordingly, after the reflective light 141 is substantially reflected by the first surface 121 of the light reflective layer pattern 120 and then penetrates through the inside of the substrate 110, it is finally transmitted through the rear surface of the substrate 110 again. At this point, the transmitted reflective light 141 has an image of the light reflective layer pattern 120. Then, the reflective light 141 is incident to the wafer 160 because its path is changed by a reflector system 150 constituting EUVL equipment. At this point, the reflector system 150 provably includes a combination of four to six reflectors. By the reflective light 141 reaching the wafer 160, a resist layer (not shown) coated on the wafer 160 is partially exposed according to a pattern image.

During this wafer exposure process for pattern transfer, because the first surface 121 of the light reflective layer pattern 120 and the first surface 131 of the light absorption layer 130 substantially have the same surface height, where the extreme ultraviolet light 140 is incident or reflected, defects formed in a pattern image or failure of pattern transfer due to the height difference of a light absorption layer in a conventional art can be suppressed.

Moreover, because a second surface 123 facing the first surface 121 of the light reflective layer pattern 120 or a second surface 133 facing the first surface 131 of the light absorption layer 130 is exposed during a mask fabricating process, defective layers or faulty pattern transfer may occur at the second surface 123 of the light reflective layer pattern 120 and the second surface 133 of the light absorption layer 133. However, according to the invention, because the light 141 is reflected after the light 140 is incident to the rear surface of the substrate 110 and penetrates through the inside of the substrate 110 to reach the light reflective layer pattern 120, faulty transfer image can be prevented.

Furthermore, because the second surface 123 of the light reflective layer pattern 120 and the second surface 133 of the light absorption layer 133 are irrelevant to the exposure process, the occurrence of failures can be suppressed during the exposure process by using a simple cleaning process. Furthermore, even if a passivation layer or film is formed on the light reflective layer pattern 120 or the light absorption layer 130 to prevent defects, a faulty transfer image can be prevented during an exposure process because the extreme ultraviolet light 140 or the light reflective layer 141 does not penetrate through the passivation layer or film.

Figure 4:
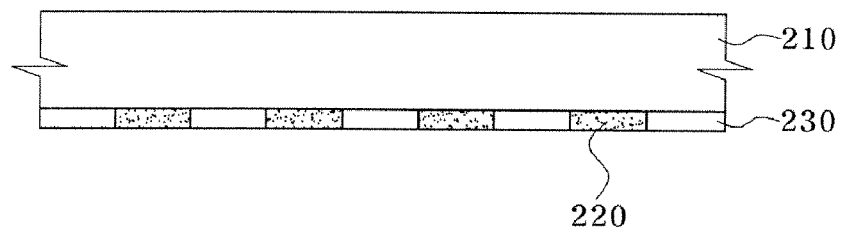
FIG. 4 illustrates a cross-sectional view of a mask used in EUVL and a method of fabricating the same according to second embodiment of the invention.

FIG. 4 illustrates a cross-sectional view of a mask used in EUVL and a method of fabricating the same according to second embodiment of the invention.

Referring to FIG. 4, a mask used in EUVL according to the second embodiment of the invention includes a light reflective layer pattern 220 after a light reflective layer is formed and patterned on one surface of a transparent substrate 210 as illustrated in FIGS. 1 and 2. Then, after covering light absorption on the surface of the substrate 210, a light absorption layer pattern 230 can be formed to expose the surface of the light reflective layer pattern 220 by planarizing the light absorption layer. At this point, this planarization process is preferably performed using one of chemical mechanical polishing (CMP) and etch back to expose the surface of the light reflective layer pattern 220. In this case, because the surface of the light reflective layer pattern 230 is exposed, defects on the surface of the light reflective layer pattern 220 can be more easily removed by using a cleaning process, and it may be more advantageous for covering the light reflective layer pattern 220 by a passivation layer.

According to the embodiments of the invention, because there is no height difference between the light absorption layer and the light reflective layer pattern, the mask can be provided in EUVL to suppress defective pattern transfer. Additionally, a method of fabricating the EUVL mask and the exposure method using the same can be also provided.

While the invention has been described with respect to the specific embodiments, various changes and modifications may be made without departing from the spirit and scope of the invention as defined in the following claims.

What is claimed is:

1. A wafer exposure method comprising:
   preparing a mask comprising light reflective layer patterns on a front surface of a transparent substrate and a light absorption layer filling between the light reflective layer patterns;
   allowing an extreme ultraviolet light (EUV) to be incident to a rear surface of the transparent substrate, the rear surface being opposite to the front surface; and
   performing an exposure process on a wafer by applying the EUV to the rear surface to be incident though the substrate and to be reflected at an interface between the front surface and the light reflective layer pattern.

2. The method of claim 1, wherein preparing the mask comprises:
   forming a light reflective layer pattern on the transparent substrate to reflect an incident extreme ultraviolet light transmitted through the transparent substrate; and
   forming a light absorption layer on the substrate to fill between the light reflective layer patterns and absorb the incident extreme ultraviolet light.

3. The method of claim 1, wherein the light absorption layer covers an upper portion of the light reflective layer pattern.

* * * * *